(12) United States Patent
Copel et al.

(10) Patent No.: US 10,416,199 B2
(45) Date of Patent: Sep. 17, 2019

(54) MEASURING FLUX, CURRENT, OR INTEGRATED CHARGE OF LOW ENERGY PARTICLES

(71) Applicant: INTERNATIONAL BUSINESS MACHINES CORPORATION, Armonk, NY (US)

(72) Inventors: Matthew W. Copel, Yorktown Heights, NY (US); Michael S. Gordon, Yorktown Heights, NY (US); Kenneth P. Rodbell, Sandy Hook, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 133 days.

(21) Appl. No.: 15/408,075

(22) Filed: Jan. 17, 2017

(65) Prior Publication Data
US 2018/0203045 A1 Jul. 19, 2018

(51) Int. Cl.
*G01R 19/00* (2006.01)
*G01R 29/24* (2006.01)

(52) U.S. Cl.
CPC .......... *G01R 19/0061* (2013.01); *G01R 29/24* (2013.01)

(58) Field of Classification Search
CPC ............. G01R 19/0061; G01R 29/24; H01J 2237/24564
See application file for complete search history.

(56) References Cited

U.S. PATENT DOCUMENTS

| | | | | |
|---|---|---|---|---|
| 6,355,921 B1* | 3/2002 | Staton | ........ | G01J 1/44 250/207 |
| 8,921,774 B1* | 12/2014 | Brown | ........ | H01J 49/26 250/282 |
| 2003/0077544 A1* | 4/2003 | Yamamoto | ........ | B82Y 10/00 430/296 |

(Continued)

FOREIGN PATENT DOCUMENTS

| | | |
|---|---|---|
| EP | 2105763 A1 | 9/2009 |
| WO | 2006089021 A2 | 8/2006 |
| WO | 2008083020 A2 | 7/2008 |

OTHER PUBLICATIONS

Mohanty, Smruti Ranjan, et al., "Development of Multi Faraday Cup Assembly for Ion Beam Measurements from a Low Energy Plasma Focus Device," Japanese Journal of Applied Physics, vol. 44, No. 7A, pp. 5199-5205 (2005).

*Primary Examiner* — Jermele M Hollington
*Assistant Examiner* — Feba Pothen
(74) *Attorney, Agent, or Firm* — Intelletek Law Group, PLLC; Gabriel Daniel, Esq.

(57) ABSTRACT

An apparatus and method for measuring flux, current, or integrated charge of a beam are provided. The apparatus and method include a cup on which the beam is incident. The cup includes an inner cylinder, a coaxial cylinder, and an aperture. The coaxial cylinder surrounds the inner cylinder and is electrically insulated therefrom. An offset current source is in electrical communication with the inner cylinder. An electrometer, a charge integrator, or a counter may be electrically connected to the cup and the offset current source. When the beam is incident on the cup and aligned with the aperture, the electrometer can measure the beam current and the charge integrator can measure the integrated charge of the beam.

18 Claims, 4 Drawing Sheets

(56) References Cited

U.S. PATENT DOCUMENTS

| | | |
|---|---|---|
| 2004/0113093 A1 | 6/2004 | Mack |
| 2005/0017645 A1 | 1/2005 | Wahlin |
| 2006/0089021 A1 | 4/2006 | Kanamaru |
| 2007/0077366 A1 | 4/2007 | Keum et al. |
| 2010/0207601 A1* | 8/2010 | Berrian ................ H01J 37/244 324/76.11 |
| 2013/0057250 A1 | 3/2013 | Kopalidis et al. |

* cited by examiner

US 10,416,199 B2

MEASURING FLUX, CURRENT, OR INTEGRATED CHARGE OF LOW ENERGY PARTICLES

BACKGROUND

Technical Field

The present application generally relates to measurement of the flux, current, or charge of a beam, and more particularly, to measurement of flux, current, or integrated charge of beam having low energy particles or ions.

Description of the Related Art

Beams of charged particles have many technological utilities. These beams have various attributes. One such attribute is the flux. The flux expresses the number of particles in the beam per unit area per unit time. The flux may be expressed in units of particles per square-centimeter-second (particles/cm$^2$-sec). Another attribute is the beam current. The beam current expresses the flow of electrical charge and may be expressed in amperes (A), where 1 A is equivalent to 1 coulomb per second (C/sec). One coulomb (C) is equivalent to the charge of approximately $6.242 \times 10^{18}$ electrons. Beam charge is yet another attribute and expresses the current multiplied by time. The energy associated with moving an ion with a single unit of electrical charge, for example one electron, across a potential of 1 volt (V) is defined as one electron volt (eV). The energy associated with moving one coulomb of charge across a potential of 1 V is defined as one joule (J).

A charged particle may be an elementary particle (e.g., a proton), any type of ion (e.g., He−), or a combination of particles, which bear an electrical charge such that they can be deflected using an electrical or magnetic field. The term ion, as used herein, collectively refers to any type of particle with an electrical charge.

Flux, beam current, or integrated charge measurement finds applications in many areas, including medicine, semiconductor technology, radiations technology, and other fields. Some non-limiting examples include cancer therapy, ion implantation, parity bit setting, soft error rate detection, Rutherford Backscatter Spectroscopy (RBS), etc.

Flux may be measured with various detectors. Specifically, flux may be calculated from an ion count which can be measured by surface barrier detectors. Such detection is possible when the beam energy is of the order of 1 MeV or larger.

Faraday cups may also be used to measure ion count. Faraday cups are susceptible to errors from noise, from leakage currents, and from lack of electron suppression, among other things. Theoretically, some of these errors can be overcome by making the depth of the Faraday cup infinitely deep or reducing the electrical noise.

SUMMARY

According to one embodiment of the disclosure, a system is provided for accurately measuring flux, beam current, or the integrated charge of a beam. The system includes an inner cylinder, a coaxial outer cylinder electrically insulated from the inner cylinder, and an offset current source in electrical communication with the inner cylinder. The inner cylinder is also in communication with an electrometer counter that is configured to measure flux, current, or charge to measure beam current or flux and a charge integrator with a counter to measure the integrated charge of the beam over a time period.

According to one embodiment of the disclosure, a method is provided to measure an attribute of a beam. The method includes providing an inner cylinder, a coaxial outer cylinder insulated from the inner cylinder, an offset current source in electrical communication with the inner cylinder, and a counter, in electrical communication with the inner cylinder. The counter is configured to measure flux, current, or the integrated charge of the beam.

According to another embodiment of the disclosure, a method is provided to measure the flux of a beam using a cup that includes an inner cylinder, an outer cylinder, and an aperture. The method includes grounding a coaxial outer cylinder and adjusting the offset current, without the beam present, until an output of a counter is at a predetermined value. The beam is aligned with the aperture in the cup. The beam current is measured using an electrometer electrically connected to the cup. The flux is determined using the beam current and the area of the aperture.

DETAILED DESCRIPTION

In the following detailed description, numerous specific details are set forth by way of examples in order to provide a thorough understanding of the relevant teachings. It should be apparent, however, that the present teachings may be practiced without such details. In other instances, well-known methods, procedures, components, and/or circuitry have been described at a relatively high-level, without detail, in order to avoid unnecessarily obscuring aspects of the present teachings.

The present disclosure relates to accurately measuring the flux, beam current, or beam charge of low energy ions. To that end, a Faraday cup can measure the beam current of ions in a beam in real time. Charge integrators can be used with the Faraday cup to determine the integrated charge of the beam, which is current multiplied by time. This is especially useful during an experiment, where the beam current is rarely constant and the results of the experiment can be normalized to the integrated charge over the duration of the experiment.

When the energy of the beam is much lower than 1 MeV, problems may occur. For example, electrical noise, associated with the detector or the associated electronics, may destroy the accuracy of the measurement. Such noise may be inherent to the detector, for example to detection circuitry or to amplification circuitry. Moreover, physical barriers may adversely affect the count due to, for example, a barrier layer of silicon on the front face of the detector.

To obtain accurate measurements using a Faraday cup, the electrical noise affecting the cup is kept sufficiently small as compared to the measurement itself. Therefore, to measure low beam currents (e.g., in the order of pico-amperes (pA), a low-noise Faraday cup may be used. In one aspect, the teachings herein provide a system and method of accurately testing large-area, low-current, low-energy beams. Accordingly, beams with energies less than 100 KeV can be accurately measured.

Figure 1:
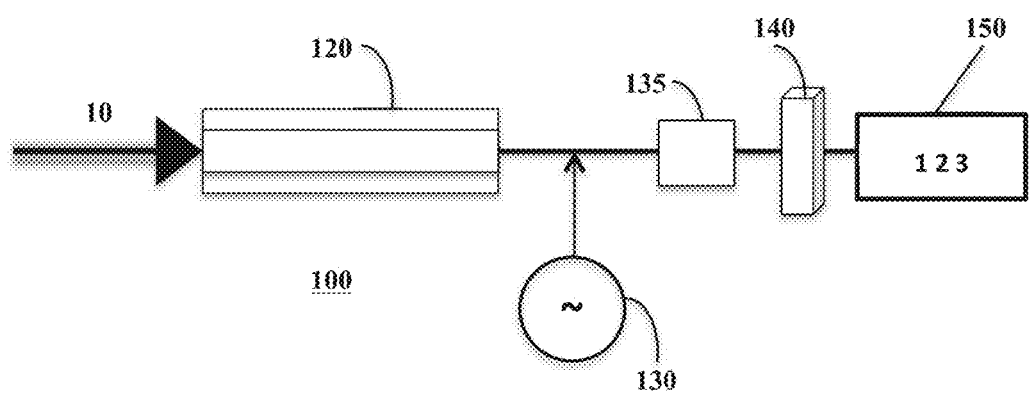
FIG. 1 illustrates a measuring apparatus, consistent with an exemplary embodiment.

With reference to FIG. 1, the measuring apparatus 100 is depicted as having a cup 120. The cup 120 is electrically connected to electrometer 135, to an offset current source 130, a charge integrator 140, and a charge counter 150. The apparatus 100 is configured to measure the beam current, or integrated charge, from an ion beam 10 when the beam 10 is incident on the cup 120. The combination of the charge integrator 140 and counter 150 may be used to determine the beam charge over the duration of an experiment.

During operation of the apparatus 100, the offset current source 130 is energized to provide an offset current for the cup 120. The electrometer 135 and charge integrator 140 are electrically connected to the cup 120 to detect an output when the cup detects an ion. The offset current from the offset current source 130 is adjusted so that an accurate measurement of the flux, current, or integrated charge of beam 10 can be made. In one embodiment, the offset current is set such that the output of the counter 150 is null when there is no beam. The offset current may be adjusted to oppose any leakage current in the apparatus 100 as a result of the imperfect electrical insulation between a cylinder 220, a coaxial cylinder 240, and/or disk 250, discussed in more detail in connection with FIG. 2. In one embodiment, source 130 may be a current source. In operation, the current source 130 is used so that electrometer 135, charge integrator 140, and counter 150 read zero when there is no beam 10 incident upon the cup 120. Further still, instead of null, the electrometer and/or the output of the counter and/or integrator can be set to a predetermined value other than null that corresponds to the offset from the leakage current and permits an accurate measurement of the beam 10.

The charge integrator 140 may be any charge integrator, including, without limitation, a traditional op-amp amplifier or other circuits that provide charge integration.

The output of the charge integrator 140 may be electrically connected to a counter 150 that provides an accurate measurement of the integrated charge for the beam 10. In one embodiment, the counter 150 may provide a real-time reading of the beam charge, for example, in units of coulombs or micro-coulombs. The electrometer 135 may be calibrated to indicate the beam current, for example, in units of amperes, micro-amperes, nano-amperes, or pico-amperes. Alternatively, the charge integrator 140 may include an electrometer or any other known charge measuring device.

In various embodiments, the electrometer 135, charge integrator 140, and the counter 150 may be separate modules or may be integrated into a single module. The functions of the electrometer 135, charge integrator 140 and the counter 150 can be implemented in hardware, software, or a combination thereof. In the context of software, the blocks 135, 140, and 150 represent computer-executable instructions that, when executed by one or more processors, perform the recited operations. Generally, computer-executable instructions may include routines, programs, objects, components, data structures, and the like that perform particular functions or implement particular abstract data types.

Figure 2:
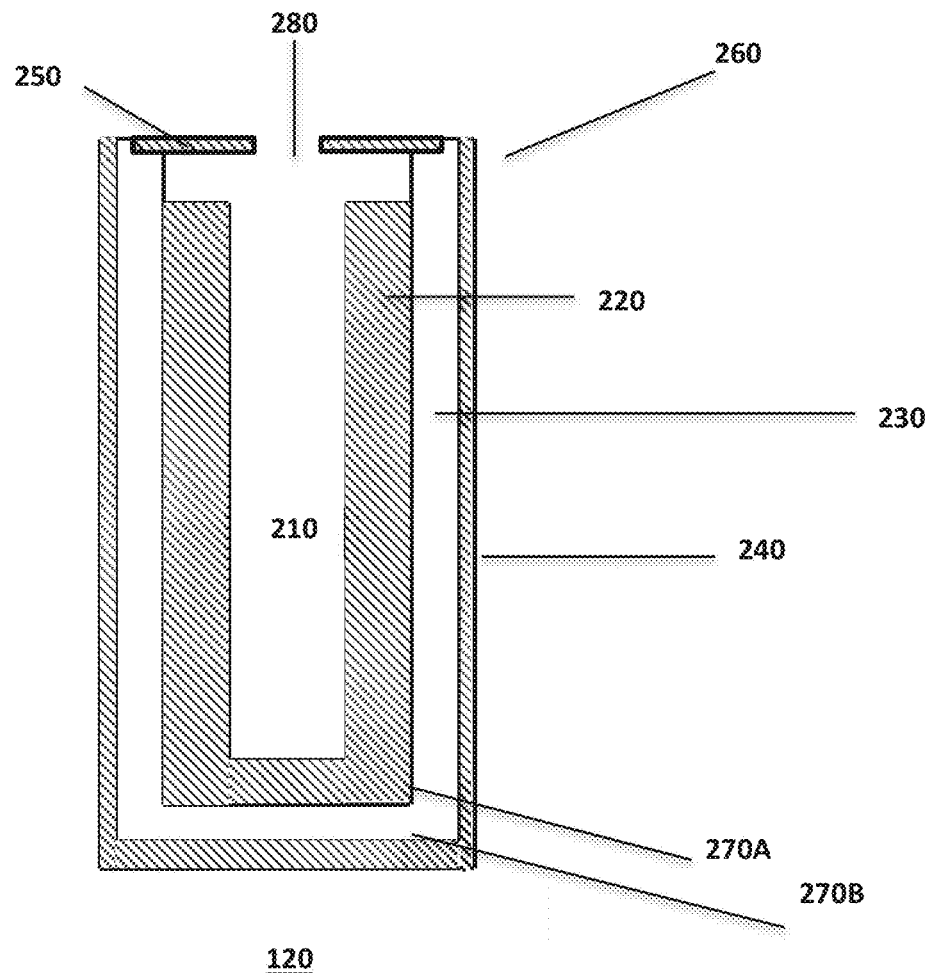
FIG. 2 is a more detailed illustration of an embodiment of a cup of the measuring apparatus of FIG. 1, consistent with an exemplary embodiment.
Figure 3A:
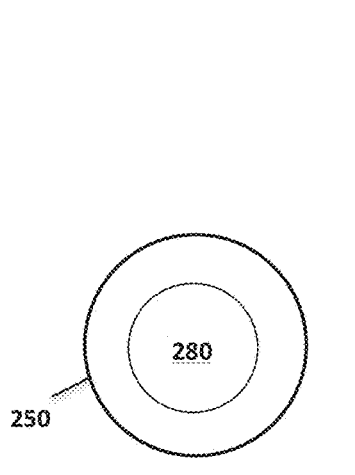
FIG. 3A illustrates a top view of a disc of the cup of FIG. 2, consistent h an exemplary embodiment.
Figure 3B:
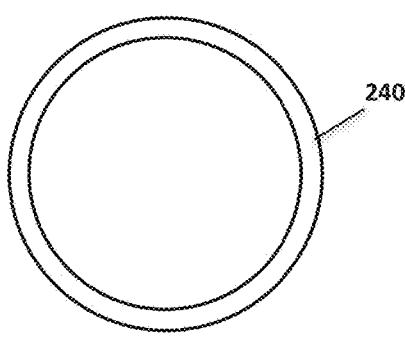
FIG. 3B illustrates a top view of a coaxial cylinder of the cup of FIG. 2, consistent with an exemplary embodiment.
Figure 3C:
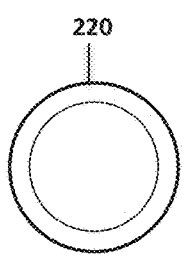
FIG. 3C illustrates a top view of an inner cylinder of the cup of FIG. 2, consistent with an exemplary embodiment.

Reference now is made to FIG. 2, which is a more detailed illustration of an embodiment of the cup 120 of the measuring apparatus of FIG. 1, consistent with an exemplary embodiment. FIGS. 3A-3C show top views of elements shown in FIG. 2. FIGS. 2, 3A-3C illustrate that the cup 120 of FIG. 1 may be of a cylindrical geometry with an interior 210, an open end 260, and a closed end. The cup 120 preferably has a high-aspect-ratio geometry, that is, the length is much larger than the diameter. In one embodiment, the outer diameter of the cup 120 may be approximately 0.5 inches and the length of the cup may be approximately 3 inches. As such, the aspect ratio is 6 or greater. The dimensions provided are for reference purposes and not intended to be limiting.

Surrounding the interior 210 is an inner cylinder 220. The cylinder 220 may comprise an electrically conductive material, for example, copper or stainless steel.

Positioned on the exterior of the cylinder 220 is an electrical insulator 230. The electrical insulator 230 may be made from any suitable insulating material, for example, from known plastics such as polyurethane, polyethylene terephthalate (PET), or ceramics. The closed end 270B of the electrical insulator 230 may include electrical access to the cylinder 220.

Surrounding the insulator 230 is an outer coaxial cylinder 240. The coaxial cylinder 240 is electrically conductive and is electrically grounded. It is electrically isolated from the inner structure, in particular from the cylinder 220. This feature allows the apparatus 100 to effectively reduce electrical noise and therefore to improve measurement accuracy. For example, the inner structure of the cup 120 is shielded from external electromagnetic interference and noise, created by ambient conditions or nearby circuitry. In one embodiment, the coaxial cylinder 240 is constructed of copper.

The open end 260 includes an electrically conductive disc 250. The disc 250 is made from, for example, tantalum. The disc 250 is electrically insulated from the cylinder 220 and from the coaxial cylinder 240. The disc 250 may be energized to a suitable bias voltage to provide electron suppression, which may be required to improve measurement accuracy. In one embodiment, the bias voltage may be −100V. The voltage can be provided by any known method, including electrically connecting the disc 250 to a power supply, battery, or voltage source.

The disc 250 includes a central opening, which may form an aperture 280. The presence of the disc 250 and aperture 280 provide electron suppression so that any secondary electrons, created when the beam 10 stops at the closed end of the cylinder 220, remain inside cylinder 220. The aperture 280 additionally defines a circular area from which the flux of the beam 10 passing through the aperture, can be determined provided the beam is larger than the aperture 280.

Referring back to FIG. 1, during operation, the beam 10 is incident on the apparatus 100. The beam is generally aligned with the apparatus 100. Depending on the size of beam 10 and its focus condition, all, or a portion of the beam passes through the aperture 280, enters the interior 210, and stops at the closed end 270A of the cylinder 220. The ions in the beam, captured in this manner, create an electrical current that can be transmitted as an output signal from the cylinder 220. The signal can be transmitted in any known manner including wired connections. This signal is transmitted to an electrometer 135, which measures the beam current. The signal can also be transmitted to a charge integrator 140, which measures the integrated beam charge. The electrometer 135 the charge integrator 140, and the counter 150 may be combined into a single measuring unit. The reading on the counter 150 is calibrated to indicate the integrated beam charge in the desired units.

It should be noted that the reference to the flux, the beam current, and the integrated beam charge is for illustration purposes only and is not intended to be limiting. Those skilled in the art appreciate that any such measurement of the electrical charge, irrespective of the units used, can be measured and displayed by a counter device as disclosed herein.

The configuration of the apparatus 100 provides increased sensitivity and improved accuracy that enable measurements of beam current of the order of pico-amperes. For example, the configuration of the disc 250 and the aperture 280 maximizes electron suppression contributing to high sensitivity for measurement of beams with low current and low energies. The coaxial cylinder 240 shields the electrical effects of the beam in the interior 210 of the cylinder 220 from ambient noise and external electromagnetic effects, enabling highly accurate measurements. Moreover, the offset current provided by current supply 130 cancels any effects from leakage currents of the apparatus on measurements.

In an alternative embodiment, the inner surface of cylinder 220 and more specifically the portion across from the open end of cylinder may be coated with a material to reduce the emission of secondary electrons when the beam 10 stops on the open end of the cylinder. Using such a coating may eliminate or reduce the need for the biased disk 250. In yet another embodiment, both a coating and a bias voltage may be combined. In yet another embodiment, the surface of cylinder 220, for example at the open end, can be significantly roughened to reduce the generation and emission of secondary electrons.

The coating may be the same as or a different composition from that of the cylinder. Possible coatings may include a very rough surface. They may also include low-atomic number materials, such as "Dag 154" (Acheson brand) or graphite suspended in solvent. Such low-atomic number materials may be deposited in a high aspect ratio, that is, they may be deposited to a high profile above the depositing surface.

Example Process

Figure 4:
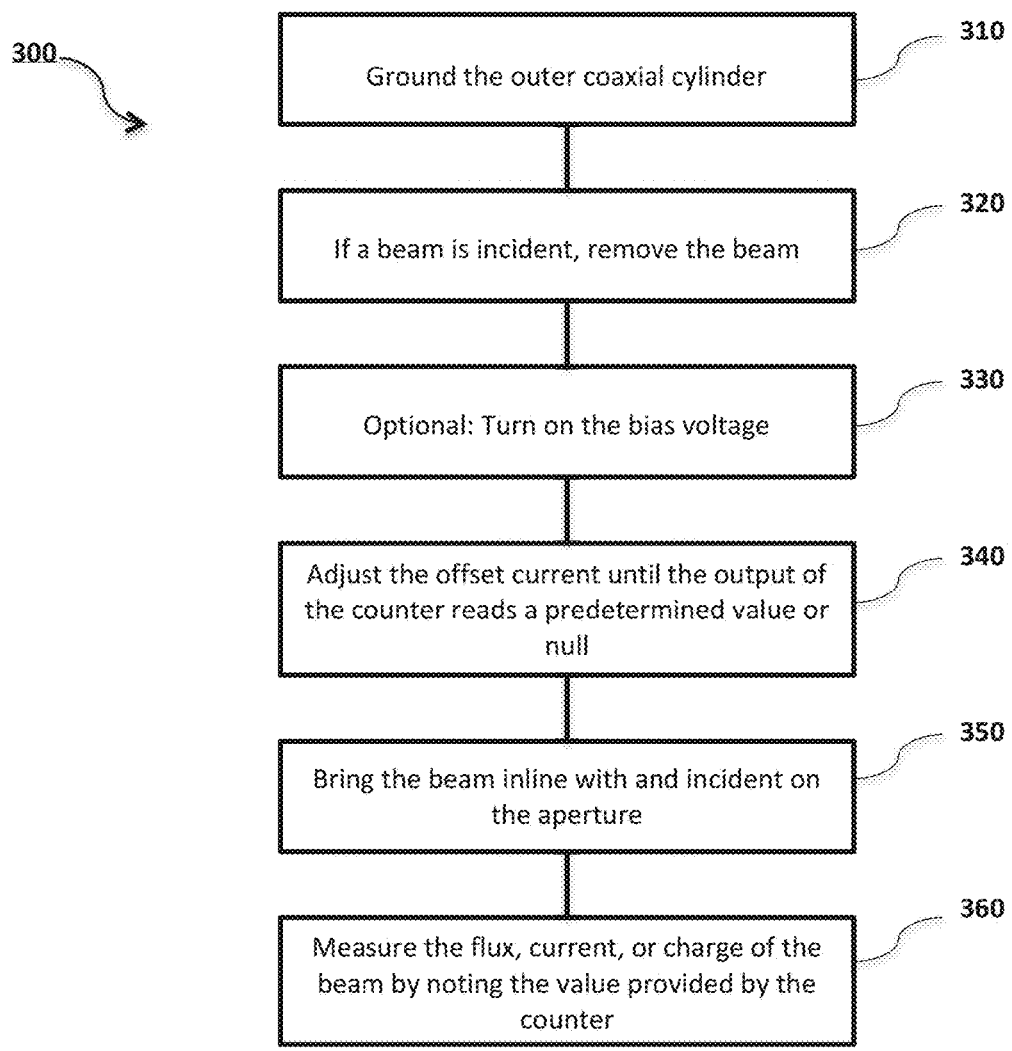
FIG. 4 presents one illustrative process for measurement, consistent with an exemplary embodiment.

With the foregoing overview of the measuring apparatus 100 and the example structures as illustrated in FIGS. 1-2, it may be helpful now to consider a high-level discussion of an example process. To that end, FIG. 4 presents an illustrative process 300 for measuring, for example, the flux, current, or integrated charge of low energy ions using the measuring apparatus of FIGS. 1-2. Process 300 is illustrated as a collection of blocks in a logical flowchart, which represents a sequence of operations, some or all of the steps of which can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or performed in parallel to implement the process. For discussion purposes, the process 300 is described with reference to the apparatus 100 of FIG. 1 and the cup 120 of FIG. 2.

At block 310, the outer coaxial cylinder is electrically grounded by providing a connection to ground.

As indicated at block 320, a determination is made whether the beam is incident on the apparatus 100. If so, the beam is removed.

At block 330, the bias voltage is turned on to energize the disc 250 on the apparatus 100. As explained herein, this block may be omitted if no bias voltage is applied.

At block 340, the offset current 130 is adjusted without an incident beam on apparatus 100, until the electrometer 135, or the integrator 140, reads zero and the counter 150 does not increase in value.

At block 350, the beam is brought back into the path of apparatus 100. The apparatus 100 makes the requisite measurements of the beam current using the electrometer 135, or the integrated charge of the beam using the charge integrator 140, with counter 150. At block 360, the counter 150 indicates the measurement of the integrated charge of the beam. The flux of the beam can be calculated by the ratio of current, as measured by the electrometer 135, and indicated by, for example, the counter, divided by the cross sectional area of the aperture 280, provided that the beam is uniform, and larger in size than the aperture 280. For example, a single elementary particle such as an electron, or proton, or an ion with a single charge (e.g., He) has an electrical charge of 1.602E-19 C. (1 C=1 A*1 sec.) A beam of protons with a current of 1 pA is equivalent to 6.242E6 protons per second. Thus, if this beam of particles uniformly fills the aperture 280 with a given area, A, in units of $cm^2$, then the particle flux, in each pA of beam current is 6.242E6 protons per second per A $cm^2$.

In one embodiment, an experiment might be performed where the cup assembly as depicted in FIG. 2 might be put into a beam of particles, and the current measured with electrometer 135. Then the cup assembly may be taken out of the beam and a device is irradiated for a period of time. Finally, the cup can be put back into the beam and a new beam current measured with electrometer 135. The average of the beam currents can be used to determine the average beam flux for the experiment. Multiplying the flux by the duration of the experiment yields the fluence, which is the beam particle count per unit area.

In another embodiment, the cup assembly as depicted in FIG. 2 remains in the beam for the duration of the experiment. Upon reaching a predetermined integrated beam charge as measured by charge integrator 140 and counter 150, the beam may be turned off, blanked, or a beam stop inserted into the path of the beam. As such, removing the beam encompasses blocking the incidence of the beam on the cup in various manners.

The apparatus 100 can be implemented in various ways. For example, it can be formed in modules that interconnect or as a single packaged device. The packaged device may be implemented as a mechanical device, a micromechanical device, or as a solid-state device without limitation. While the device may be miniaturized or enlarged depending on the application. In one embodiment, the apparatus is configured to be implemented in a portable and/or hand-held form factor.

Specifically, the inner cylinder, outer coaxial cylinder, insulator, disc, and electrical connections may take different forms depending on the physical implementation of the apparatus 100. For example, the inner cylinder, coaxial cylinder, insulator, disc, and electrical connections can be implemented as a layer structure within a package or substrate. The coaxial cylinder, for example, may be implemented as a cylinder of conductive material. Alternatively, it may be created by conductive deposits in the package or substrate as a layer or in the form of track deposits. This technology is known, for example, in creating electrical via structures in insulating substrates. These and similar known fabrication technologies can be applied, without limitation, to the constructions of all portions of the apparatus 100.

Additionally, the fabrications technologies mentioned in the above paragraph may be applied without limitation to the electrically insulating portions of the apparatus 100. For example, as long as the coaxial cylinder is electrically insulated from the inner cylinder in a manner to provide appropriate electromagnetic shielding, the insulator 230 can be formed in any configuration.

Moreover, the electrical connections in the apparatus 100 can be made by any known method. For example, conductive wires can be connected to affect the connection directly or through conventional connectors. Printed tracks and substrate connection assemblies may also be used.

With the powerful measurement capability and flexible form factor of the disclosed embodiments for measuring beam flux, current, or integrated charge, the methods and systems discussed herein may be used for testing and measurement in laboratory or manufacturing facilities. One example of such use would be to measure soft error rates for solid-state devices. Another would be to program solid-state devices. Another such example might be for ion beam analysis. Many testing and programming applications of solid-state devices are known in the art. By way of illustration, an example may be to cause an SEU (Single Event Upset) in solid-state devices. The SEU may be caused by direct ionization with low energy protons, for example, with energies of less than 100 keV. Because the disclosed embodiments may be capable of detecting and measuring such low energy protons, the flux or fluence of the beam of particles can be properly calibrated and its effect on a device measured. Moreover, to quantify the SEU, the beam fluence is determined. The teachings herein are capable of determining the beam fluence for such low energy proton beams.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, or the discussions relating to them, is intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented in hardware or by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A cup for measuring an attribute of a beam of ions comprising:
    an inner cylinder;
    a coaxial cylinder, surrounding the inner cylinder and electrically insulated therefrom;
    an electrometer in electrical communication with the inner cylinder and configured to measure a beam current; and
    an offset current source in electrical communication with the inner cylinder and configured to be adjusted until the electrometer provides a measurement of a predetermined value,
    wherein the cup is configured to determine a flux from the beam current and an area of an aperture of the cup.

2. The system of claim 1, wherein the inner cylinder is in electrical communication with a charge integrator.

3. The system of claim 1, wherein the inner cylinder is in electrical communication with a counter.

4. The system of claim 1, wherein the inner cylinder has an aspect ratio higher than 2.

5. The system of claim 1, wherein the aperture is at an open end of the inner cylinder.

6. The system of claim 5, wherein a bias voltage is applied to the aperture at the open end.

7. The system of claim 1, wherein a surface of the inner cylinder is coated with a first composition.

8. The system of claim 7, wherein the first composition is different from a composition of the inner cylinder.

9. The system of claim 8, wherein the first composition is a low atomic weight material.

10. The system of claim 1, wherein a beam current measured by the electrometer is less than 1 nano-amperes.

11. A method of measuring an attribute of a beam comprising:
    providing an inner cylinder with a surface, the inner cylinder configured to provide an output;
    providing a coaxial cylinder that surrounds the inner cylinder and is electrically insulated therefrom;
    providing an offset current source in electrical communication with the inner cylinder and configured to generate an offset current that is adjusted until an electrometer provides a measurement of a predetermined value;
    measuring a beam current with the electrometer; and
    determining a flux from the beam current and an area of an aperture of the coaxial cylinder.

12. The method of claim 11, further comprising electrically connecting one of an electrometer, a charge integrator, and a counter with the inner cylinder.

13. The method of claim 11, wherein the aperture is at a first end of the inner cylinder.

14. The method of claim 13, further comprising applying a bias voltage to the first end of the inner cylinder.

15. The method of claim 11, wherein at least a portion of the surface of the inner cylinder is coated with a first composition.

16. The method of claim 15, wherein the first composition is different from a composition of the inner cylinder.

17. The method of claim 11, wherein the method is used to measure flux, current, or integrated charge in situ.

18. A method of measuring a flux of a beam using a cup having a coaxial cylinder that surrounds an inner cylinder and is insulated therefrom, the cup including an aperture and in communication with an electrometer, a current integrator, and a counter, the method comprising:
    grounding the coaxial cylinder;
    upon determining that the beam is incident on the cup, removing the beam;
    receiving measurements from the electrometer indicative of the leakage current of the cup;
    adjusting an offset current until the electrometer provides a measurement of a predetermined value;
    aligning the beam with the cup;
    measuring a beam current with the electrometer; and
    determining the flux from beam current and an area of the aperture.

* * * * *